(12) United States Patent
Kamal et al.

(10) Patent No.: US 6,479,348 B1
(45) Date of Patent: Nov. 12, 2002

(54) METHOD OF MAKING MEMORY WORDLINE HARD MASK EXTENSION

(75) Inventors: Tazrien Kamal, San Jose, CA (US); Minh Van Ngo, Fremont, CA (US); Mark T. Ramsbey, Sunnyvale, CA (US); Jeffrey Shields, Sunnyvale, CA (US); Jean Y. Yang, Sunnyvale, CA (US); Emmanuil Lingunis, San Jose, CA (US); Hidehiko Shiraiwa, San Jose, CA (US); Angela T. Hui, Fremont, CA (US)

(73) Assignees: Advanced Micro Devices, Inc., Sunnyvale, CA (US); Fujitsu Limited, Kanagawa-ken (JP)

( * ) Notice: Subject to any disclaimer, the term of this patent is extended or adjusted under 35 U.S.C. 154(b) by 0 days.

(21) Appl. No.: 10/109,516

(22) Filed: Aug. 27, 2002

(51) Int. Cl.[7] ............................................ H01L 21/8247
(52) U.S. Cl. ..................... 438/258; 438/261; 438/591
(58) Field of Search ................................. 438/211, 216, 438/258, 261, 266, 267, 591, 636

(56) References Cited

U.S. PATENT DOCUMENTS

| | | | | |
|---|---|---|---|---|
| 5,496,756 A | * | 3/1996 | Sharma et al. ............... | 438/258 |
| 6,180,458 B1 | * | 1/2001 | Krautschneider et al. ... | 438/267 |
| 6,403,417 B1 | * | 6/2002 | Chien et al. ................. | 438/258 |
| 6,417,086 B1 | * | 7/2002 | Osari ......................... | 438/263 |

* cited by examiner

Primary Examiner—Chandra Chaudhari
(74) Attorney, Agent, or Firm—Mikio Ishimaru (57) ABSTRACT

A manufacturing method is provided for an integrated circuit memory with closely spaced wordlines formed by using hard mask extensions. A charge-trapping dielectric material is deposited over a semiconductor substrate and first and second bitlines are formed therein. A wordline material and a hard mask material are deposited over the wordline material. A photoresist material is deposited over the hard mask material and is processed to form a patterned photoresist material. The hard mask material is processed using the patterned photoresist material to form a patterned hard mask material. The patterned photoresist is then removed. A hard mask extension material is deposited over the wordline material and is processed to form a hard mask extension. The wordline material is processed using the patterned hard mask material and the hard mask extension to form a wordline, and the patterned hard mask material and the hard mask extension are then removed.

20 Claims, 5 Drawing Sheets

METHOD OF MAKING MEMORY WORDLINE HARD MASK EXTENSION

BACKGROUND OF THE INVENTION

1. Technical Field

The present invention relates generally to semiconductor technology and forming wordlines in flash memory.

2. Background Art

Different types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lack erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing multiple bits to be stored in a single cell is known as "MirrorBit®" Flash memory has been developed. In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

A major problem with the MirrorBit architecture has been in the forming of closely spaced wordlines and the use of materials compatible with the processes used to form the wordlines when shrinking the size of the overall MirrorBit architecture.

A solution to this problem has been long sought but has long eluded those skilled in the art.

DISCLOSURE OF THE INVENTION

The present invention provides a manufacturing method for an integrated circuit by using a memory wordline hard mask extension. A charge-trapping dielectric layer is deposited over a semiconductor substrate. First and second bitlines are formed in the semiconductor substrate. A wordline layer is deposited over the charge-trapping dielectric layer and a hard mask layer is deposited over the wordline layer. A photoresist layer is deposited over the hard mask layer and is processed to form a patterned photoresist layer. The hard mask layer is processed using the patterned photoresist layer to form a patterned hard mask layer. The patterned photoresist is then removed. A hard mask extension layer is deposited over the wordline layer and the hard mask extension layer is processed to form a hard mask extension. The wordline layer is processed using the hard mask and the hard mask extension to form wordlines. This allows wordline width and spacing to be closely controlled, and the space between them to be easily reduced in size. The hard mask and the hard mask extension are then removed.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
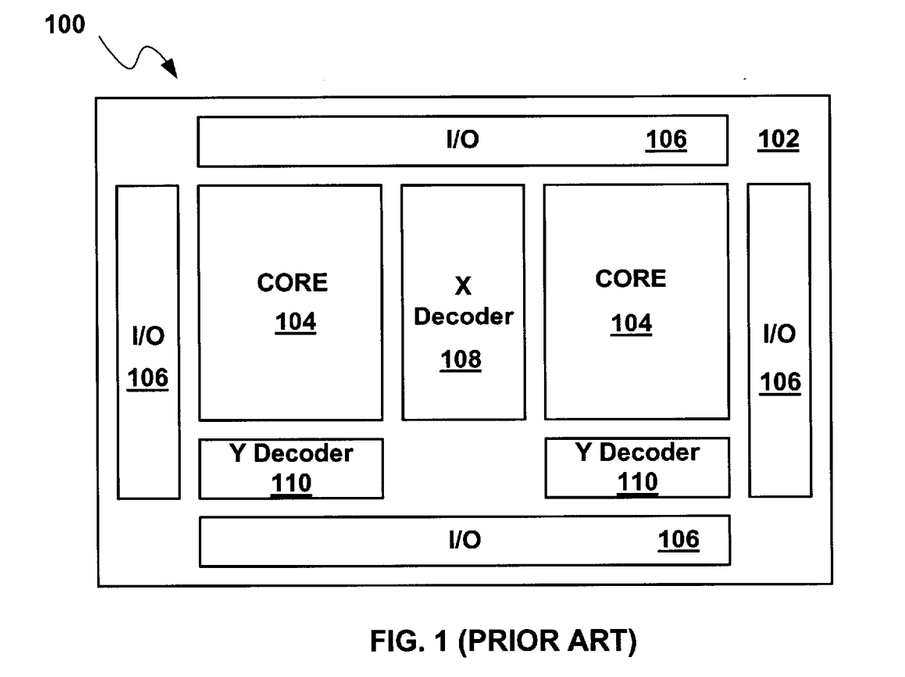
FIG. 1 (PRIOR ART) is a plan view of a conventional MirrorBit Flash EEPROM.

Referring now to FIG. 1 (PRIOR ART), therein is shown a plan view of a MirrorBit® Flash EEPROM 100, which commonly includes a semiconductor substrate 102 in which one or more high-density core regions and one or more low-density peripheral portions are formed. High-density core regions typically include one or more M×N array cores 104 of individually addressable, substantially identical MirrorBit Flash memory cells. Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface the semiconductor substrate 102 regardless of its orientation. The term "vertical" refers to a direction perpendicular to the horizontal as just defined. Terms, such as "on", "above", "below", "higher", "lower", "over", "under", "side" and "beside", are defined with respect to these horizontal and vertical planes. The term "processed" as used herein is defined to include one or more of the following: depositing or growing semiconductor materials, masking, patterning, photolithography, etching, implanting, removal, and/or stripping.

Figure 2:
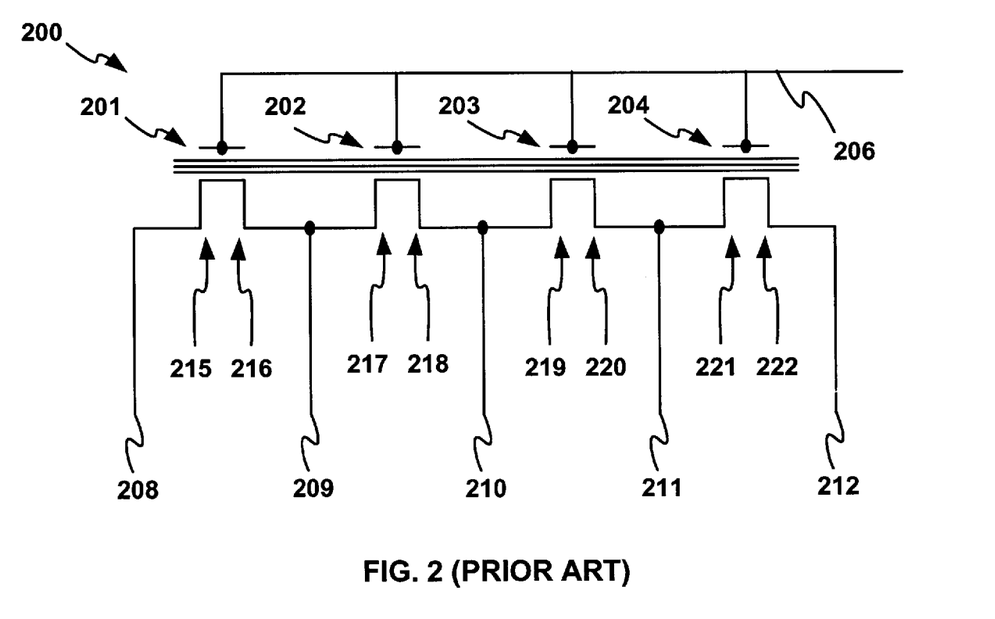
FIG. 2 (PRIOR ART) is a circuit schematic of a portion of one of the M×N array cores of FIG. 1 (PRIOR ART)

Referring now to FIG. 2 (PRIOR ART), therein is shown a circuit schematic of a portion of one of the M ×N array cores 104 of FIG. 1 (PRIOR ART). The circuit schematic shows a line of memory cells 200, which includes memory cells 201 through 204 and which together can form an 8-bit word. Each of the memory cells 201 through 204 is connected to a wordline 206, which acts as a control gate. Each of the memory cells 201 through 204 has two associated bitlines with most of the memory cells having a common bitline. The memory cell 201 has associated bitlines 208 and 209; the memory cell 202 has associated bitlines 209 and 210; the memory cell 203 has associated bitlines 210 and 211; and the memory cell 204 has associated bitlines 211 and 212.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. Although adjacent memory cells share common bitlines, the adjacent memory cells do not interfere with each other because the memory cells are programmed one at a time and only one memory cell is active at a time while programming.

Figure 3:
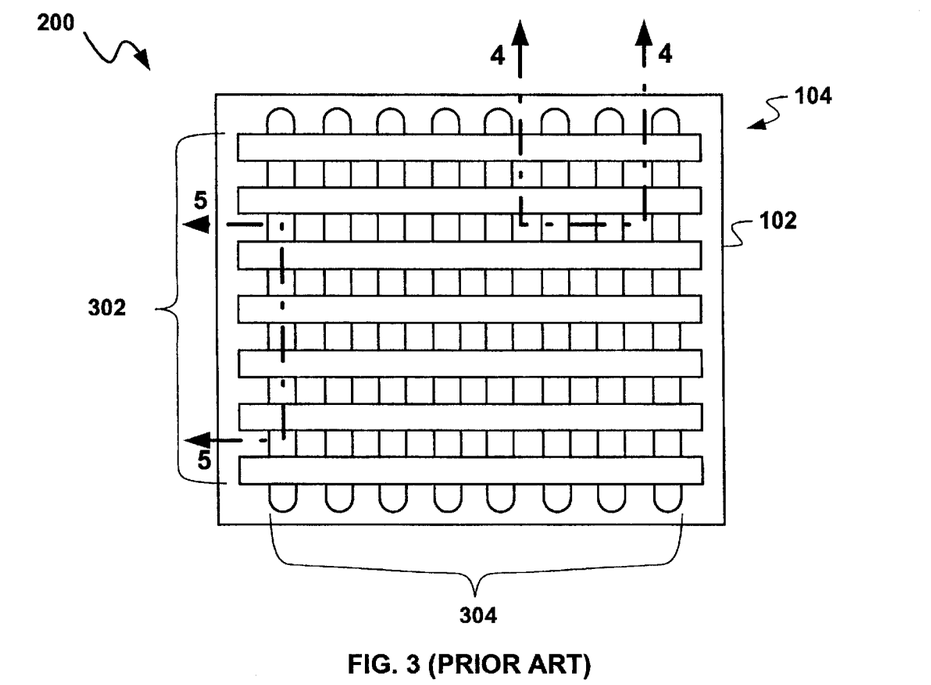
FIG. 3 (PRIOR ART) is a plan view of a portion of one of the M×N array cores 104 of FIG. 1 (PRIOR ART)

Referring now to FIG. 3 (PRIOR ART), therein is shown a plan view of a portion of one of the M ×N array cores 104 of FIG. 1 (PRIOR ART). The semiconductor substrate 102 has a plurality of implanted bitlines 304 extending in parallel with a plurality of formed wordlines 302 extending in parallel and at right angles to the plurality of implanted bitlines 304. The wordlines 302 and bitlines 304 have contacts and interconnections (not shown) to the programming circuitry represented in part by x-decoders 108 and y-decoders 110 of FIG. 1 (PRIOR ART).

Figure 4:
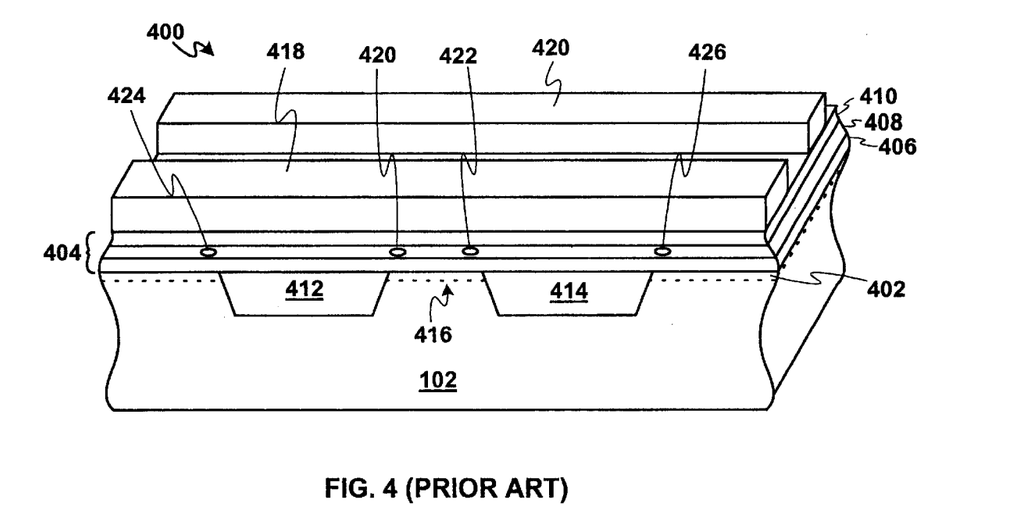
FIG. 4 (PRIOR ART) is a cross-sectional isometric view of a typical MirrorBit Flash memory cell along the line 4—4 of FIG. 3 (PRIOR ART)

Referring now to FIG. 4 (PRIOR ART), therein is shown a cross-sectional isometric view of a typical MirrorBit Flash memory cell along the line 4—4 of FIG. 3 (PRIOR ART), such as a memory cell 400. The semiconductor substrate 102 is a p-doped silicon substrate with a threshold adjustment implant 402 of a p-type material, such as boron. The threshold adjustment implant 402 provides a region that is more heavily doped than the semiconductor substrate 102 itself and assists in the control of the threshold voltage of the memory cell 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are of an oxide dielectric such as silicon dioxide ($SiO_2$) and the charge-trapping layer 408 is of a nitride dielectric such as silicon nitride ($Si_xN_y$). The oxide-nitride-oxide configuration is frequently referred to as a matter of convenience as an "ONO layer".

The bitlines 304 of FIG. 3 (PRIOR ART) are implanted under the charge-trapping dielectric layer 404 in the semiconductor substrate 102 as typified by first and second conductive bitlines 412 and 414. They are typically of an implanted n-type material, such as arsenic, and can include an oxide portion (not shown) in some embodiments. The first and second conductive bitlines 412 and 414 are spaced apart and define a volume between them with the threshold adjustment implant 402, which is a channel 416.

A material, such as polysilicon, is deposited over the charge-trapping dielectric layer 404, patterned, etched, and stripped resulting in a wordline 418. The wordline 418 is one of the wordlines 302 in FIG. 3 (PRIOR ART).

It is understood that the implementation of each step in manufacturing has associated processing steps.

The locations 420 through 422 indicate where bits can be stored in the memory cell 400 and locations 424 and 426 are adjacent locations, which are independent of the memory cell 400.

As explained briefly earlier, a major problem with the MirrorBit architecture has been in the forming of closely spaced wordlines and the use of materials compatible with the processes used to form the wordlines when shrinking the size of the overall MirrorBit architecture. The photolithographic process is limited in how closely spaced apart the hard mask can place the wordlines.

Figure 5:
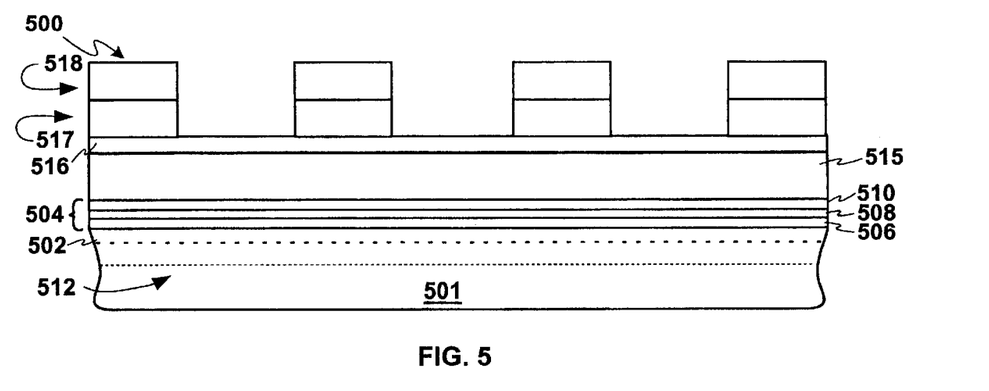
FIG. 5 is a cross-sectional view of a partially processed memory cell similar to a cross-sectional view along line 5—5 in FIG. 3 (PRIOR ART) during an intermediate step of the manufacturing process.

Referring now to FIG. 5, therein is shown a cross-sectional view of a partially processed memory cell 500 similar to a cross-sectional view along line 5—5 in FIG. 3 (PRIOR ART). A p-type silicon substrate 501 has been implanted or processed with a p-type threshold adjustment implant 502.

A charge-trapping dielectric layer 504 is deposited over the silicon substrate 501. The charge-trapping dielectric layer 504 generally can be composed of three separate layers: a first insulating layer 506, a charge-trapping layer 508, and a second insulating layer 510. The first and second insulating layers 506 and 510 may be of an oxide dielectric such as silicon dioxide ($SiO_2$) or silicon oxynitride (SiON) and the charge-trapping layer 508 may be of a nitride dielectric such as silicon nitride ($Si_xN_y$) to form an ONO layer. It will be noted that the present invention is not limited to specific dielectric or charge-trapping materials.

The bitlines, as typified by a first n-type bitline 512, are implanted under the chargetrapping dielectric layer 504 in the silicon substrate 501 and a wordline layer 515, polysilicon, has been deposited over the charge-trapping dielectric layer 504. Again, it will be noted that the present invention is not limited to specific bitline or gate materials. For example, NPN structures are shown but the structures can also be PNP.

A hard mask layer 516 has been deposited over the wordline layer 515. An optional anti-reflective coating (ARC) layer 517 has been deposited over the hard mask layer 516 and a photoresist layer 518 has been deposited over the ARC layer 517. Further, both the photoresist layer 518 and the ARC layer 517 have been processed (i.e., the layers have been deposited, masked, patterned, exposed, and etched) into a combination photomask 520 for processing the hard mask layer 516. The hard mask layer 516 has not been processed Referring now to FIG. 6, therein is shown the structure of FIG. 5 after formation of a patterned hard mask layer 519 and removal of the combination photomask 520. The patterned ARC layer 517 can be removed at this point or left on the patterned hard mask layer 519 as shown. The patterned hard mask layer 519 has spaces 521 through 523 and is used to create the structure of FIG. 7.

Figure 6:
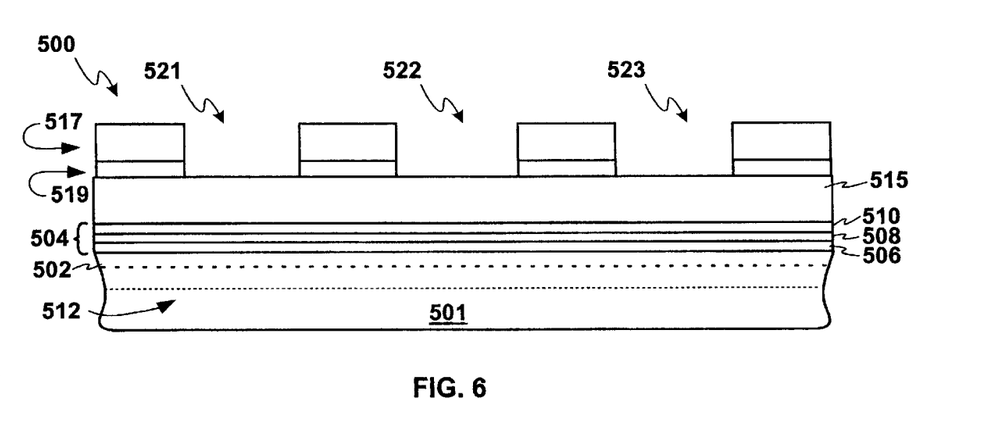
FIG. 6 is a cross-sectional view of the structure of FIG. 5 during an intermediate step of forming hard masks.
Figure 7:
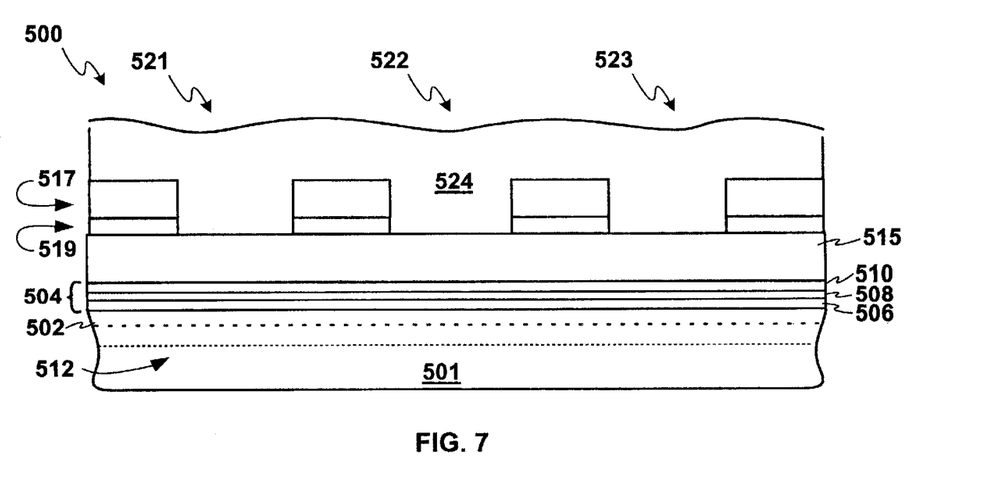
FIG. 7 is a cross-sectional view of the structure of FIG. 6 during an intermediate step in which an extension layer is deposited.

Referring now to FIG. 7, therein is shown the structure of FIG. 6 after deposition of a hard mask extension layer 524. It has been discovered that the hard mask extension layer 524 can be a deposited inorganic material, such as a deposited oxide, which has a high density as a result of being a high-temperature oxide or an undoped oxide. The high-temperature oxide would be one deposited from about 750° C. to about 800° C. and the undoped oxide would be an oxide deposited by a physical chemical vapor deposition (PCVD) process. An oxide is used since it is conformal and will tend to oxidize the layer of the ARC 517, which is generally of nitride, to ease its removal during the formation of the hard mask extension as will be hereinafter described.

Figure 8:
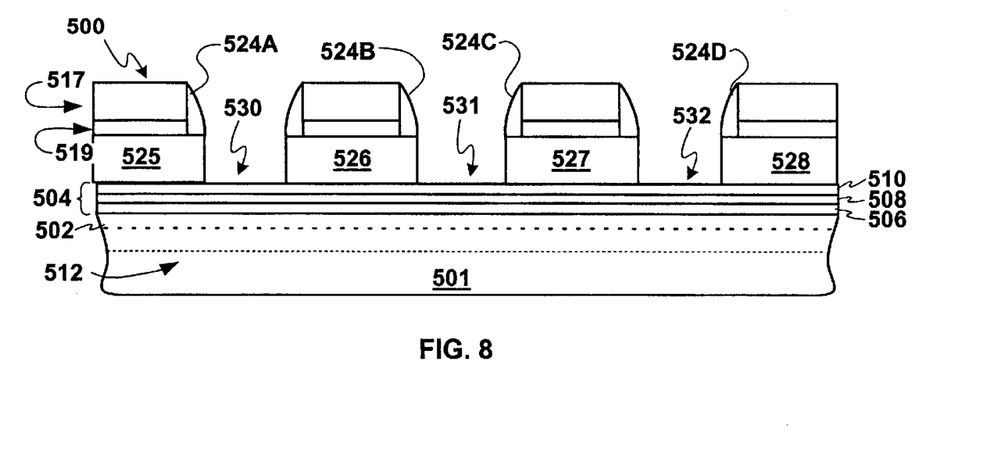
FIG. 8 is a cross-sectional view of the structure of FIG. 7 during an intermediate step in which hard mask extensions have been formed and wordlines etched.

Referring now to FIG. 8, therein is shown the structure of FIG. 7 after processing using an isotropic etch followed by an anisotropic etch.

The isotropic etch is used to form the hard mask extensions 524A through 524D by etching the hard mask extension layer 524 down to the tops of the wordline layer 515. The isotropic etch above will remove any of the ARC layer 517 remaining on the patterned hard mask layer 519, which will make subsequent removal of the patterned hard mask layer 519 easier.

The patterned hard mask layer 519 and the hard mask extensions 524A through 524D are used with an anisotropic process to form wordlines 525 through 528 having wordline spaces 530 through 532.

The wordline spaces 530 through 532 are smaller than in conventional memory devices and allow closer spacing of the wordlines 525 through 528. Thus, the wordline width and spacing can be controlled very closely. The wordline spaces 530 through 532 are easily reduced in size to below about 70 nm.

Figure 9:
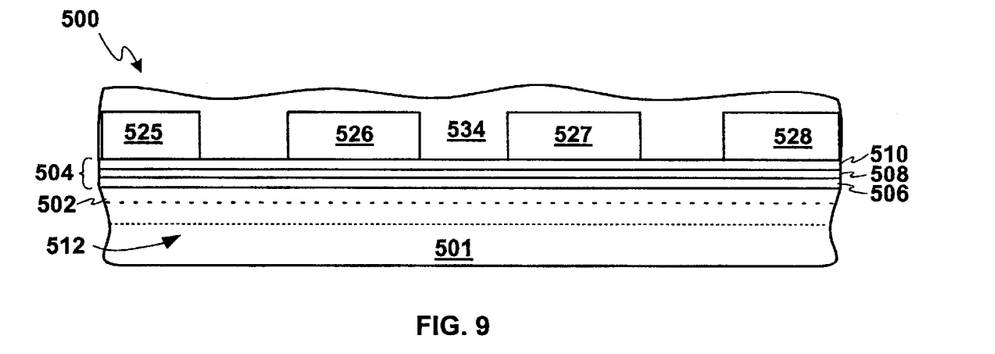
FIG. 9 is a cross-sectional view of the structure of FIG. 8 during an intermediate step in which the hard masks and hard masked extensions have been removed and a spacer layer deposited.

Referring now to FIG. 9 therein is shown the structure of FIG. 8 after removal of the patterned hard mask layer 519 and the hard mask extensions 524A through 524D. An inorganic spacer layer 534 has been deposited.

Figure 10:
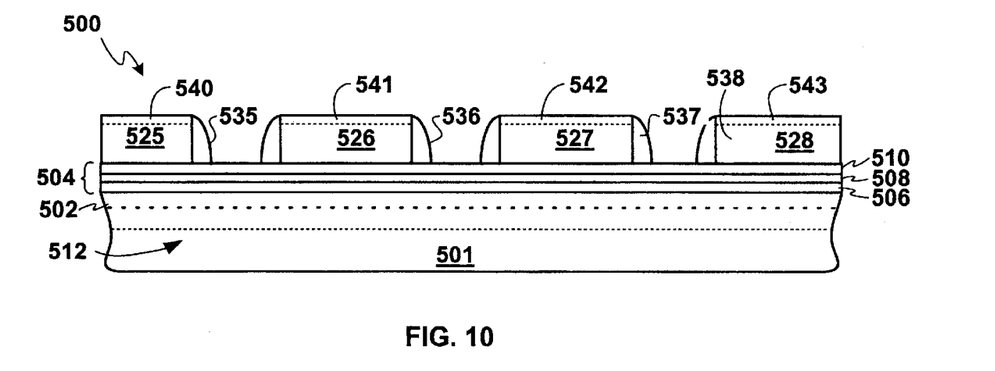
FIG. 10 is a cross-sectional view of the structure of FIG. 9 during an intermediate step in which wordline spacers have been formed.

Referring now to FIG. 10, therein is shown the structure of FIG. 9 after etching of spacer layer 534 to form wordline spacers 535 through 538 around the respective wordlines 525 through 528. If the wordline spacers 535 through 538 are not formed, an additional masking step of the entire core is required or additional processing steps to provide access to the bitlines.

Figure 11:
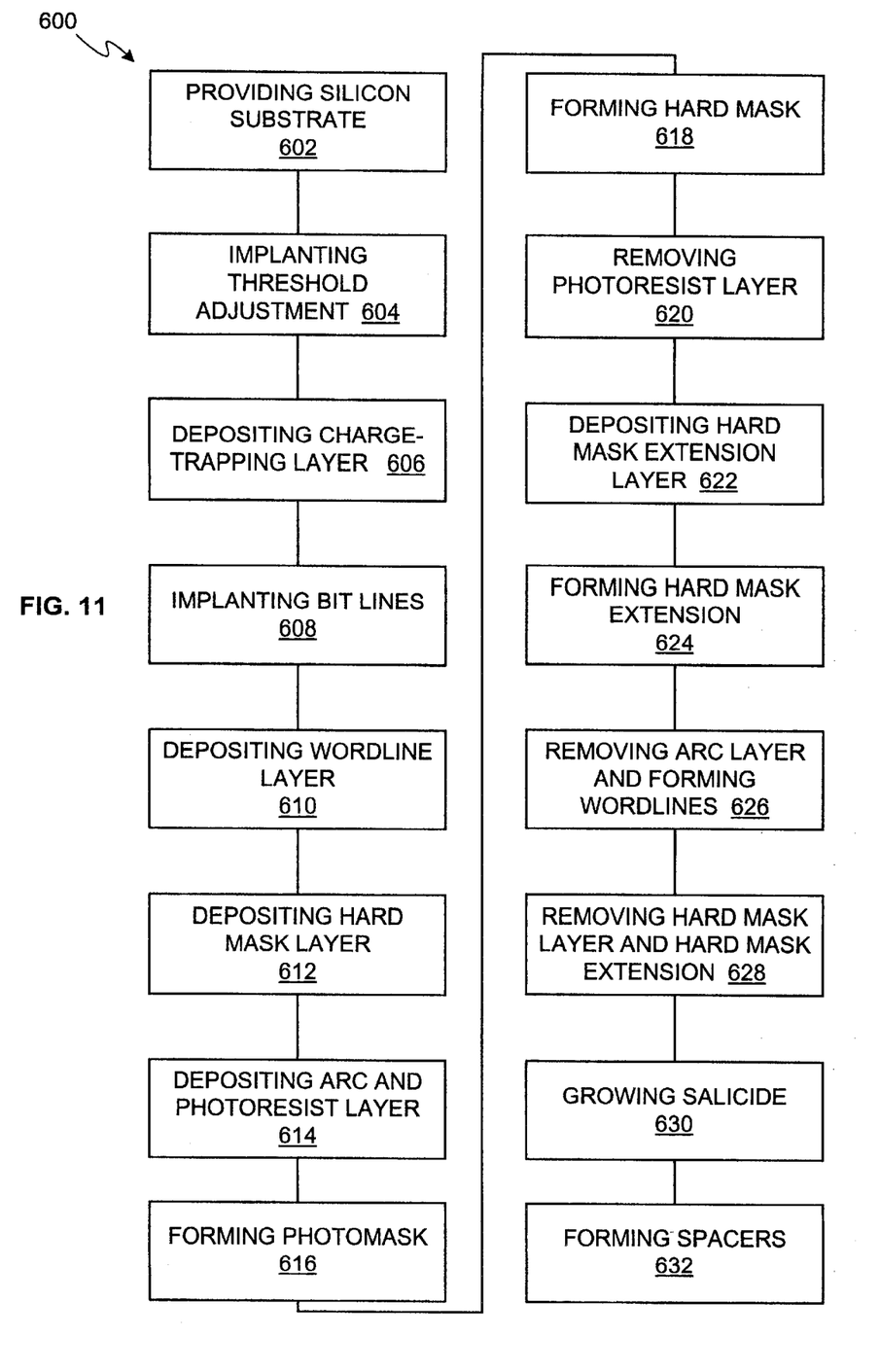
FIG. 11 is a simplified process chart of the present invention.

Referring now to FIG. 11, therein is shown a simplified process chart 600 of the present invention which includes: providing a semiconductor substrate 602; implanting a threshold adjustment implant 604; depositing a charge-trapping dielectric layer 606; implanting bitlines 608; depositing wordline layer 610; depositing hard mask layer 612; depositing ARC and photoresist layer 614; forming a photomask 616; forming hard mask 618; removing photoresist layer 620; depositing hard mask extension layer 622; forming hard mask extension 624; removing ARC layer and forming wordlines 626, removing hard mask layer and hard mask extension 628, growing salicide 630, and forming spacers 632. Various alternative sequences, additions, and deletions to this process chart would be obvious to those skilled in the art from a detailed reading of the present disclosure.

Various implementations of the method may be used in different electronic devices and especially the dual bit memory cell architecture may be achieved according to one or more aspects of the present invention. In particular, the invention is applicable to memory devices wherein both bits in a dual bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:

depositing a charge-trapping dielectric material over a semiconductor substrate;

forming first and second bitlines in the semiconductor substrate;

depositing a wordline material over the charge-trapping dielectric material;

depositing a hard mask material over the wordline material;

depositing a photoresist material over the hard mask material;

processing the photoresist material to form a patterned photoresist material;

processing the hard mask material using the patterned photoresist material to form a patterned hard mask material;

removing the patterned photoresist material;

depositing a hard mask extension material;

processing the hard mask extension material to form a hard mask extension;

processing the wordline material using the patterned hard mask material and the hard mask extension to form a wordline; and removing the patterned hard mask material and the hard mask extension.

2. The method of manufacturing an integrated circuit as claimed in claim 1 wherein depositing the hard mask extension material deposits a high-density oxide.

3. The method of manufacturing an integrated circuit as claimed in claim 1 wherein depositing the hard mask extension material deposits an oxide selected from a group consisting of high-temperature oxide and undoped oxide.

4. The method of manufacturing an integrated circuit as claimed in claim 1 wherein processing the hard mask extension material forms the hard mask extension for reducing the wordline space below about 70 nm.

5. The method of manufacturing an integrated circuit as claimed in claim 1 wherein depositing the hard mask extension material deposits a material that can be isotropically etched without harming the patterned hard mask material or the charge-trapping dielectric material.

6. The method of manufacturing an integrated circuit as claimed in claim 1 including:

depositing an anti-reflective coating material after depositing the hard mask material;

using the anti-reflective coating material to form the patterned photoresist material;

forming a patterned anti-reflective coating material; and removing the patterned anti-reflective coating material.

7. The method of manufacturing an integrated circuit as claimed in claim 1 including:

depositing an anti-reflective coating material after depositing the hard mask material;

using the anti-reflective coating material to form the patterned photoresist material;

forming a patterned anti-reflective coating material; and removing the patterned anti-reflective coating material before removing the patterned hard mask material.

8. The method of manufacturing an integrated circuit as claimed in claim 1 including:

depositing a wordline spacer material;

forming wordline spacers around the wordline; and growing a salicide material on the wordline.

9. The method of manufacturing an integrated circuit as claimed in claim 1 including implanting a threshold adjustment implant into the semiconductor substrate.

10. The method of manufacturing an integrated circuit as claimed in claim 1 wherein the charge-trapping dielectric material is composed of:

a first dielectric material;

a charge-trapping material over the first dielectric material; and a second dielectric material over the charge-trapping dielectric material.

11. A method of manufacturing an integrated circuit comprising:

depositing a charge-trapping dielectric layer over a silicon substrate;

forming first and second bitlines in the silicon substrate;

depositing a wordline layer over the charge-trapping dielectric layer;

depositing a hard mask layer over the wordline layer;

depositing an anti-reflective coating layer over the hard mask layer;

depositing a photoresist layer over the anti-reflective coating layer;

processing the photoresist layer and the anti-reflective coating layer to form a patterned photoresist layer and a patterned anti-reflective coating layer;

processing the hard mask layer using the patterned photoresist layer to form a patterned hard mask layer;

removing the patterned photoresist layer;

depositing a hard mask extension layer;

forming a hard mask extension using an isotropic etching process;

removing the patterned anti-reflective coating layer without damaging a layer selected from a group consisting of the patterned hard mask layer, the wordline layer, and a combination thereof;

forming the wordline layer using the patterned hard mask layer and an anisotropic etch process to form a wordline; and removing the patterned hard mask layer and the hard mask extension without damaging a layer selected from a group consisting of the wordline, the charge-trapping dielectric layer, and a combination thereof.

12. The method of manufacturing an integrated circuit as claimed in claim 11 wherein depositing the hard mask extension layer deposits a high-density oxide.

13. The method of manufacturing an integrated circuit as claimed in claim 11 wherein depositing the hard mask extension layer deposits an oxide selected from a group consisting of high-temperature oxide and undoped oxide.

14. The method of manufacturing an integrated circuit as claimed in claim 11 wherein processing the hard mask extension layer forms the hard mask extension for reducing the wordline space below about 70 nm.

15. The method of manufacturing an integrated circuit as claimed in claim 11 wherein depositing the hard mask extension layer deposits a material that can be isotropically etched without harming the patterned hard mask layer or the charge-trapping dielectric layer.

16. The method of manufacturing an integrated circuit as claimed in claim 11 including:

depositing an inorganic anti-reflective coating layer after depositing the oxide hard mask layer;

patterning the inorganic anti-reflective coating layer to form a patterned inorganic anti-reflective coating layer; and removing the patterned inorganic anti-reflective coating layer.

17. The method of manufacturing an integrated circuit as claimed in claim 11 including:

depositing an inorganic anti-reflective coating layer after depositing the hard mask layer;

using the inorganic anti-reflective coating layer to form the patterned photoresist layer;

forming a patterned inorganic anti-reflective coating layer; and removing the patterned inorganic anti-reflective coating layer before removing the patterned hard mask layer.

18. The method of manufacturing an integrated circuit as claimed in claim 11 including depositing an inorganic spacer layer and forming inorganic spacers around the polysilicon wordline before growing the salicide layer on the polysilicon wordline.

19. The method of manufacturing an integrated circuit as claimed in claim 11 wherein:

providing the silicon substrate provides a p-doped silicon substrate; and including:

implanting a p-type threshold adjustment implant into the p-type silicon substrate.

20. The method of manufacturing an integrated circuit as claimed in claim 11 wherein the charge-trapping dielectric layer is composed of:

a first oxide layer;

a nitride layer over the first oxide layer; and a second oxide layer over the nitride layer.

* * * * *